(12) United States Patent
Lee et al.

(10) Patent No.: US 8,796,675 B2
(45) Date of Patent: Aug. 5, 2014

(54) THIN FILM TRANSISTOR ARRAY SUBSTRATE AND METHOD OF MANUFACTURING THE SAME

(75) Inventors: Je-Hun Lee, Seoul (KR); Ki-Won Kim, Suwon-si (KR); Do-Hyun Kim, Seongnam-si (KR); Woo-Geun Lee, Yongin-si (KR); Kap-Soo Yoon, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/613,566

(22) Filed: Sep. 13, 2012

(65) Prior Publication Data

US 2013/0009151 A1    Jan. 10, 2013

Related U.S. Application Data

(62) Division of application No. 12/555,824, filed on Sep. 9, 2009, now Pat. No. 8,288,766.

(30) Foreign Application Priority Data

Sep. 12, 2008   (KR) .................. 10-2008-0090443

(51) Int. Cl.
*H01L 35/24* (2006.01)
(52) U.S. Cl.
USPC .................. 257/40; 257/43; 257/E51.001
(58) Field of Classification Search
USPC ...................................... 257/40, 43, E51.001
See application file for complete search history.

(56) References Cited

U.S. PATENT DOCUMENTS

| 7,189,992 | B2 | 3/2007 | Wager, III et al. |
| 2006/0163743 | A1 | 7/2006 | Kuwabara et al. |
| 2008/0308796 | A1 | 12/2008 | Akimoto et al. |
| 2009/0072232 | A1 | 3/2009 | Hayashi et al. |
| 2010/0051940 | A1 | 3/2010 | Yamazaki et al. |

FOREIGN PATENT DOCUMENTS

| JP | 2007073562 A | 3/2007 |
| JP | 2007073705 A | 3/2007 |
| KR | 1020010052773 A | 6/2001 |
| KR | 1020030049307 A | 6/2003 |

OTHER PUBLICATIONS

Hayashi et al., "42.1: Invited Paper: Improved Amorphous In-Ga-Zn-O TFTs", SID 08 Digest, 2008, pp. 621-624.

*Primary Examiner* — Anthony Ho
(74) *Attorney, Agent, or Firm* — Cantor Colburn LLP

(57) ABSTRACT

A TFT array substrate includes a semiconductive oxide layer disposed on an insulating substrate and including a channel portion, a gate electrode overlapping the semiconductive oxide layer, a gate insulating layer interposed between the semiconductive oxide layer and the gate electrode, and a passivation layer disposed on the semiconductive oxide layer and the gate electrode. At least one of the gate insulating layer and the passivation layer includes an oxynitride layer, and the oxynitride layer has a higher concentration of oxygen than that of nitrogen in a location of the oxynitride layer closer to the semiconductive oxide layer.

5 Claims, 12 Drawing Sheets

THIN FILM TRANSISTOR ARRAY SUBSTRATE AND METHOD OF MANUFACTURING THE SAME

This application is a divisional application of U.S. patent application Ser. No. 12/555,824 filed on Sep. 9, 2009, which claims priority to Korean Patent Application No. 10-2008-0090443 filed on Sep. 12, 2008, and all the benefits accruing therefrom under 35 U.S.C. §119, the disclosure of which is incorporated herein by reference in its entirety.

BACKGROUND OF THE INVENTION

1. Field of the Invention

The invention relates to a thin film transistor ("TFT") array substrate and a method of manufacturing the same, and more particularly, to a TFT array substrate having improved electric characteristics of an oxide semiconductor layer, and a method of manufacturing the thin film transistor array substrate.

2. Description of the Related Art

A liquid crystal display ("LCD") is one of the most commonly used flat panel displays. The LCD, which includes two panels having a plurality of electrodes thereon and a liquid crystal layer interposed therebetween, controls the transmittance of incident light by applying voltages to the electrodes to rearrange liquid crystal molecules of the liquid crystal layer.

Among LCDs, the LCD of type provided with field-generating electrodes on two substrates is extensively used. Of the two substrates, the TFT array substrate includes a plurality of pixel electrodes provided in a matrix form. On the other substrate, a common electrode covers the entire surface of the substrate.

To realize images in the LCD, data voltages are applied to the respective pixel electrodes. To this end, thin film transistors ("TFTs"), which may bee three-terminal elements, for switching the voltages are connected to the applied to the respective pixel electrodes, and a plurality of wiring lines including gate lines and data lines is formed on the substrate. Signals for controlling the TFTs are transmitted through the gate lines, and the data voltages are transmitted through the data lines.

In the conventional LCD, the TFTs are classified into an amorphous silicon TFT and a polysilicon TFT according to the material of a channel portion of a switching element. The amorphous silicon TFT has charge mobility as low as approximately 0.5 squared centimeter per volt second ($cm^2$/V-s), while achieving uniformity in electrical characteristics over a large-sized display device. On the other hand, the polysilicon TFT has charge mobility as high as approximately several hundred $cm^2$/V-s, while achieving uniformity in electrical characteristics over a large-sized display device.

BRIEF SUMMARY OF THE INVENTION

The invention provides a thin film transistor ("TFT") array substrate, which has relatively high charge mobility, while achieving uniformity in electrical characteristics over a large-sized display device.

The invention also provides a method of manufacturing a TFT array substrate, which has relatively high charge mobility, while achieving uniformity in electrical characteristics over a large-sized display device.

In an exemplary embodiment of the invention, there is provided a TFT array substrate including a semiconductive oxide layer disposed on an insulating substrate and including a channel portion, a gate electrode overlapping the semiconductive oxide layer, a gate insulating layer interposed between the semiconductive oxide layer and the gate electrode, and a passivation layer disposed on the semiconductive oxide layer and the gate electrode. At least one of the gate insulating layer and the passivation layer includes an oxynitride layer, and the oxynitride layer has a higher concentration of oxygen than that of nitrogen as it gets closer to the semiconductive oxide layer.

In an exemplary embodiment of the invention, there is provided a thin film transistor ("TFT") array substrate including a semiconductive oxide layer disposed on an insulating substrate and including a channel portion, a gate electrode overlapping the semiconductive oxide layer, a gate insulating layer interposed between the semiconductive oxide layer and the gate electrode, and a passivation layer disposed on the semiconductive oxide layer and the gate electrode. At least one of the gate insulating layer and the passivation layer includes an oxide layer and a nitride layer, the oxide layer contacting the semiconductive oxide layer, and the nitride layer not contacting the semiconductive oxide layer.

In an exemplary embodiment of the invention, there is provided a method of manufacturing thin film transistor ("TFT") array substrate, the method including forming a gate electrode on an insulating substrate, forming a gate insulating layer on the gate electrode, forming a semiconductive oxide layer on the gate insulating layer, forming a source electrode and a drain electrode separated from each other on the semiconductive oxide layer, and forming a passivation layer on the source electrode and the drain electrode. At least one of the gate insulating layer and the passivation layer is formed of an oxynitride layer, the oxynitride layer having a higher concentration of oxygen than that of nitrogen as it gets closer to the semiconductive oxide layer.

In an exemplary embodiment of the invention, there is provided a method of manufacturing thin film transistor ("TFT") array substrate, the method including forming a gate electrode on an insulating substrate, forming a gate insulating layer on the gate electrode, forming a semiconductive oxide layer on the gate insulating layer, forming a source electrode and a drain electrode separated from each other on the semiconductive oxide layer, and forming a passivation layer formed on the source electrode and the drain electrode. At least one of the gate insulating layer and the passivation layer includes an oxide layer and a nitride layer, the oxide layer contacting the semiconductive oxide layer, and the nitride layer not contacting the semiconductive oxide layer.

BRIEF DESCRIPTION OF THE DRAWINGS

The above and other features and advantages of the invention will become more apparent by describing in detail exemplary embodiments thereof with reference to the attached drawings in which:

FIG. 1b is a cross-sectional view taken along line A-A' in FIG. 1a;

FIGS. 2 to 6 are cross-sectional views showing an exemplary embodiment of a fabricating processes of a portion of the TFT substrate shown in FIG. 1a;

DETAILED DESCRIPTION OF THE INVENTION

Figure 1A:
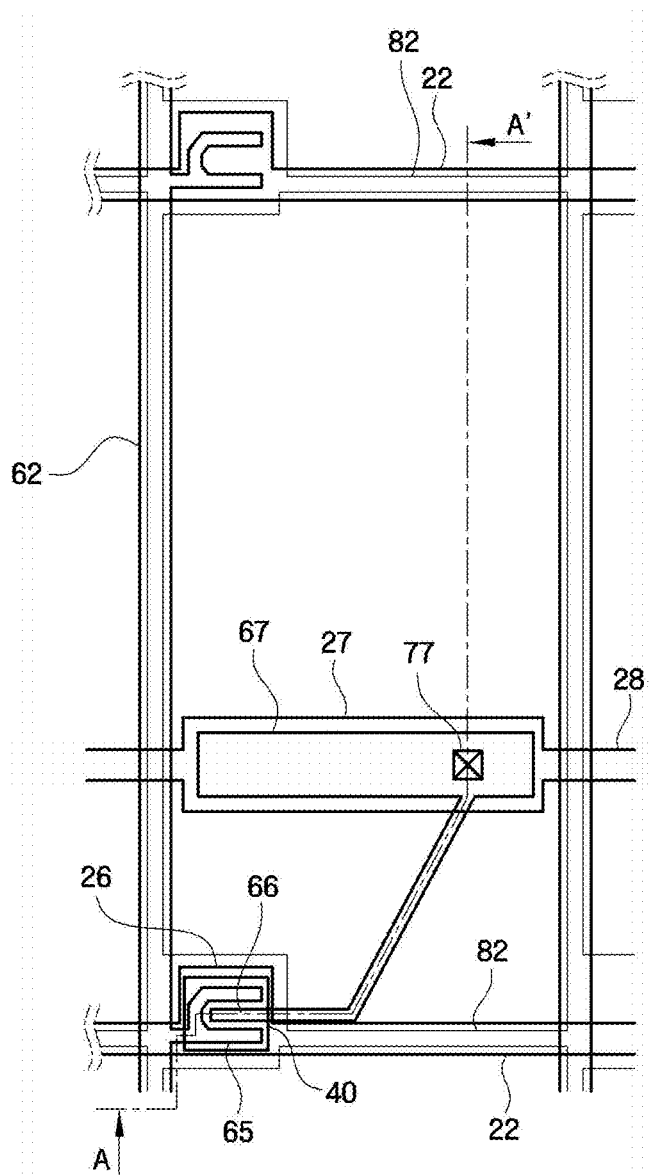
FIG. 1a is a schematic plan view of an exemplary embodiment of a thin film transistor ("TFT") substrate for a liquid crystal display ("LCD") according to the invention.

Advantages and features of the invention and methods of accomplishing the same may be understood more readily by reference to the following detailed description of exemplary embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. In the drawings, the thickness of layers, films and regions are exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like reference numerals refer to like elements throughout the specification.

The terminology used herein is for the purpose of describing particular embodiments only and is not intended to be limiting of the invention. As used herein, the singular forms a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, an exemplary embodiment a thin film transistor ("TFT") array substrate according to the invention will be described in detail with reference to FIGS. 1a through 1c. FIG. 1a is a schematic plan view of an exemplary embodiment of a TFT substrate for a liquid crystal display ("LCD") according to the invention, FIG. 1b is a cross-sectional view taken along line A-A' in FIG. 1a, and FIG. 1c is an enlarged view of a portion "B" of a TFT shown in FIG. 1b.

Figure 1B:
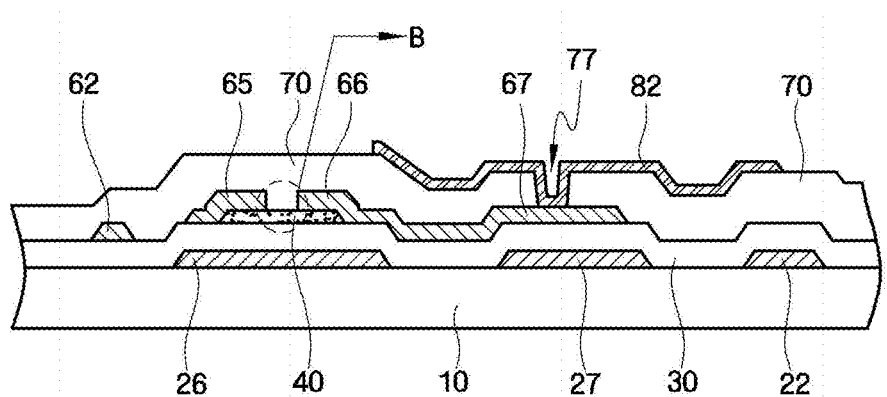
Figure 1C:
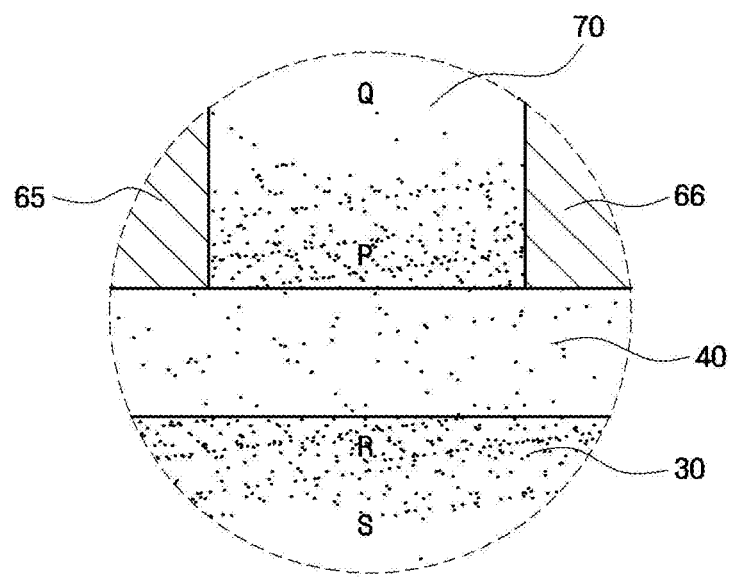
FIG. 1c is an enlarged view of a portion "B" of a TFT shown in FIG. 1b.

Referring to FIGS. 1a through 1c, a gate wiring (collectively 22 and 26) for transmitting a gate signal are disposed on an insulating substrate 10. The gate wiring (22 and 26) includes a gate line 22 longitudinally extending in a first (e.g., horizontal) direction in a plan view of the TFT substrate, and a gate electrode 26 physically and electrically connected to the gate line 22. The gate electrode 26 protrudes from the gate line 22 in a second direction inclined with respect to the first direction, such as being substantially perpendicular to the first direction. The gate electrode 26 is disposed continuous with the gate line 22, and the gate line 22 including the gate electrode 26 is a single unitary and indivisible member. The gate electrode 26 is included in a thin film transistor.

A storage wiring (collectively 27 and 28) for transmitting a storage voltage is also disposed on the insulating substrate 10. The storage wiring (27 and 28) includes a storage line 28 longitudinally extending in the first direction (e.g., horizontally), crossing a pixel region and substantially parallel to the gate line 22, and a storage electrode 27 physically and electrically connected to the storage electrode line 28. The storage electrode 27 has a greater width than a width of the storage line 28, where the widths are taken in the second direction in the plan view of the TFT substrate. The storage electrode 27 is disposed continuous with the storage line 28, and the storage line 28 is a single unitary indivisible member.

The storage electrode 27 overlaps with a drain electrode extension portion 67 connected to a pixel electrode 82, which will be described later, and forms a storage capacitor that improves the charge storage capability of a pixel unit. A shape and the position of the above-mentioned storage electrode 27 and the storage electrode line 28 may vary. In an alternative exemplary embodiment, the storage electrode 27 and the storage electrode line 28 may not be disposed in the TFT substrate, if the storage capacitance that is generated due to the overlapping of the pixel electrode 82 and the gate line 22 is sufficiently high.

In an exemplary embodiment, the gate wiring (22 and 26) and the storage wiring (27 and 28) may include an aluminum-based metal, such as aluminum (Al) and an aluminum alloy, a silver-based metal, such as silver (Ag) and a silver alloy, a copper-based metal, such as copper (Cu) or a copper alloy, a molybdenum-based metal, such as molybdenum (Mo) and a molybdenum alloy, chromium (Cr), titanium (Ti), or tantalum (Ta).

Additionally, the gate wiring (22 and 26) and the storage wiring (27 and 28) may have a multilayered structure including two conductive layers having different physical properties (not shown). Of the two conductive layers, any one conductive layer includes metal having low resistivity, for example, the aluminum-based metal, the silver-based metal, or the copper-based metal, so as to reduce signal delaying or a drop in voltage in the gate wiring (22 and 26) and the storage wiring (27 and 28). Another conductive layer may include a substance having good contact properties with zinc oxide ("ZnO"), indium tin oxide ("ITO"), and indium zinc oxide ("IZO"), such as a molybdenum-based metal, chromium, titanium, or tantalum.

With respect to the above-mentioned combination, in one exemplary embodiment, a structure that includes a lower Cr layer and an upper Al layer, or a structure that includes a lower Al layer and an upper Mo layer may be formed. However, the invention is not limited thereto. In alternative exemplary embodiments, the gate wiring (22 and 26) and/or the storage wiring (27 and 28) may include various types of metals, and conductors.

In general, hydrogen reacts with a semiconductive oxide layer 40 to reduce the semiconductive oxide layer 40, creating oxygen vacancy in the semiconductive oxide layer 40. The oxygen vacancy increases a carrier concentration of a channel portion of the semiconductive oxide layer 40. If the concentration of hydrogen contained in a gate insulating layer 30 is high, the carrier concentration increases, so that a threshold voltage (Vth) of an oxide TFT shifts toward a negative value, allowing the semiconductive oxide layer 40 to exhibit electrical characteristics, like a conductor. Accordingly, since the gate insulating layer 30 contacts the semiconductive oxide layer 40, it is important to reduce a hydrogen concentration in the gate insulating layer 30.

In an exemplary embodiment, when the gate insulating layer 30 includes oxynitride, a small amount of or little hydrogen-containing gas, such as $NH_3$, is used, or $N_2O$ gas (or $O_2$ gas), $N_2$ gas, etc., is used in a process of forming the gate insulating layer 30. That is, since the formed gate insulating layer 30 has a very small amount of hydrogen or little hydrogen, deterioration of electrical characteristics of the semiconductive oxide layer 40 can be reduced or effectively prevented.

In an exemplary embodiment of the invention, the gate insulating layer 30 preferably has a concentration of oxygen higher than nitrogen along a thickness of the gate insulating layer 30, as a location along the thickness gets closer to the semiconductive oxide layer 40. The thickness of the gate insulating layer 30 is taken in a third direction orthogonal to both the first and second directions, such as being substantially perpendicular to an upper surface of the insulating substrate 10.

Referring to FIG. 1c, a portion 'R' of the gate insulating layer 30 close to the semiconductive oxide layer 40 preferably has a higher oxygen concentration than a portion 'S' relatively far (e.g. further than 'R') from the semiconductive oxide layer 40. A density of the dots shown in FIG. 1c in an area of portion 'R' is larger than a density of the dots shown in an area of portion 'S' to illustrate the higher oxygen concentration. In an exemplary embodiment of the invention, when materials of the gate insulating layer 30 are represented by the formula $MO_xN_{1-x}$, where M is silicon (Si), aluminum (Al), titanium (Ti), zirconium (Zr), hafnium (Hf), tantalum (Ta), or tungsten (W), the gate insulating layer 30 preferably has a value of x as it gets closer to the semiconductive oxide layer 40 along the thickness of the gate insulating layer 30, because oxide is more stable than nitride, thereby more effectively improving electrical characteristics of the semiconductive oxide layer 40.

The semiconductive oxide layer 40 including an oxide selected from an element group consisting of Zn, In, Ga, Sn and combinations thereof, is disposed on the gate insulating layer 30. Exemplary materials of the semiconductive oxide layer 40 include, but are not limited to, composite oxides such as ZnO, InZnO, InGaO, InSnO, ZnSnO, GaSnO, GaZnO, GaZnSnO, or GaInZnO. The semiconductive oxide layer 40 has 2 to 100 times charge mobility higher than hydrogenated amorphous silicon and a higher on/off current ratio than hydrogenated amorphous silicon, e.g., approximately $10^5$ to $10^8$, exhibiting excellent semiconductor characteristics.

In addition, since the semiconductive oxide layer has an energy band gap of approximately 3.0 to 3.5 electron volts (eV), effectively no leakage photocurrent is generated in response to incident visible light. Hence, the formation of a momentary afterimage on a display panel using the semiconductive oxide TFT can be reduced or effectively prevented. Thus, since there is no need to dispose a light-blocking film under the semiconductive oxide TFT, an aspect ratio of an LCD can be increased.

In order to enhance the characteristics of a semiconductive oxide, an element, which belongs to group III, IV or V of a periodic table, or a transition element, may further be included in the composition of to the semiconductive oxide. Since the materials included in the semiconductive oxide layer 40 form a good ohmic contact with a data wiring (collectively 62, 65, 66 and 67), it is not necessary to disposed a separate an ohmic contact layer in the LCD, thereby reducing a processing time. Also, although the semiconductive oxide layer 40 is in an amorphous state, the semiconductive oxide layer 40 has relatively high effective mobility and can be applied to the conventional amorphous silicon manufacturing process, such as where the semiconductive oxide layer 40 can be used with a large-size display device.

An oxide TFT of the embodiment includes the semiconductive oxide layer 40 and the data wiring (62, 65, 66 and 67), which may be patterned in different manners. In one exemplary embodiment, when using a 4-mask process, the semiconductive oxide layer 40 is patterned in substantially the same shape as the data wiring (62, 65, 66 and 67), except for a channel portion of the oxide TFT. The semiconductive oxide layer 40 may be patterned in substantially the same shape as the data wiring (62, 65, 66 and 67) because the semiconductive oxide layer 40 and the data wiring (62, 65, 66 and 67) are patterned using a single etching mask. The illustrated exemplary embodiment shows a structure manufactured by a manufacturing method using five masks as described above. However, the invention may be well adapted for a method of a TFT array substrate for an LCD using three or four masks.

The data wiring (62, 65, 66 and 67) is disposed on the semiconductive oxide layer 40 and the gate insulating layer 30. The data wiring (62, 65, 66 and 67) include a data line 62 that longitudinally extends in the second direction (e.g., vertically) and crosses a gate line 22. In one exemplary embodiment, data lines 62 which are crossed with gate lines 22 may define a pixel area, but the invention is not limited thereto.

The data wiring further includes a source electrode 65 that branches off from the data line 62 and extends to overlap an upper portion of the semiconductive oxide layer 40, a drain electrode 66 that is separated from and faces the source electrode 65 with respect to the gate electrode 26 or a channel portion of the oxide TFT, and is disposed overlapping an upper portion of the semiconductive oxide layer 40, and the drain electrode extension portion 67 that extends from the drain electrode 66 and has a wide width taken in the second direction, extending from the drain electrode 66 and overlapping the storage electrode 27. The source electrode 65 is disposed continuous with the data line 62, and the data line 62 including the source electrode 65 is a single unitary and indivisible member. The drain electrode extension portion 67 is disposed continuous with the drain electrode 66, to collectively form a single unitary indivisible member.

The data wiring (62, 65, 66 and 67) includes a material that directly contacts the semiconductive oxide layer 40, forming an ohmic contact therebetween. If the data wiring (62, 65, 66 and 67) includes a material having a work function smaller than that of a material of the semiconductive oxide layer 40, the ohmic contact can be formed between the two materials. In one exemplary embodiment, if the work function of the material of the semiconductive oxide layer 40 is approximately 5 eV or greater, e.g., approximately 5.1 to 5.3 eV, the data wiring (62, 65, 66 and 67) may include a material having a work function of approximately 5.3 eV or less. If the difference between the work function of the data wiring (62, 65, 66 and 67) and that of the semiconductive oxide layer 40 is approximately 1.5 eV or less, reduced contact resistance characteristics can be obtained.

In exemplary embodiments, in order to form the ohmic contact with the semiconductive oxide layer 40, the data wiring (62, 65, 66 and 67) may be formed as a single layer or multiple layers made of Ni, Co, Ti, Ag, Cu, Mo, Al, Be, Nb, Au, Fe, Se or Ta as shown in Table 1 below. Alternatively, the data wiring (62, 65, 66 and 67) may include an alloy of any one or more of the above metals and at least one element selected from the group consisting of Ti, Zr, W, Ta, Nb, Pt, Hf, O and N.

Table 1 below shows a work function of each metal that may be used for the data wiring (62, 65, 66 and 67).

TABLE 1

| | Metal | | | | | |
|---|---|---|---|---|---|---|
| | Ni | Co | Ti | Ag | Cu | Mo |
| Work function (eV) | 5.01 | 5.0 | 4.7 | 4.73 | 4.7 | 4.5 |
| | Metal | | | | | |
| | Al | Be | Nb | Au | Fe | Se |
| Work function (eV) | 4.08 | 5.0 | 4.3 | 5.1 | 4.5 | 5.11 |

If the semiconductive oxide layer 40 directly contacts a metal such as Al, Cu or Ag, the characteristics of the oxide TFT, which uses the metal as the data wiring (62, 65, 66 and 67), and/or the ohmic contact characteristics of the semiconductive oxide layer 40 with transparent indium tin oxide ("ITO") or indium zinc oxide ("IZO") used as the pixel electrode 82, may deteriorate due to reaction or diffusion between the semiconductive oxide layer 40 and the directly contacting metal. Therefore, the data wiring (62, 65, 66 and 67) may have a double-layered structure or a triple-layered structure.

If Al or an alloy of Al and any one of Nd, Sc, C, Ni, B, Zr, Lu, Cu and Ag is used for the data wiring (62, 65, 66 and 67), the data wiring (62, 65, 66 and 67) may be formed as multiple layers including different types of layers formed on and/or under Al or the Al alloy. In an exemplary embodiment, the data wiring (62, 65, 66 and 67) is a double layer including any one of Mo(Mo alloy)/Al(Al alloy), Ti(Ti alloy)/Al(Al alloy), Ta(Ta alloy)/Al(Al alloy), Ni(Ni alloy)/Al(Al alloy) and Co(Co alloy)/Al(Al alloy) or a triple layer including any one of Ti(Ti alloy)/Al(Al alloy)/Ti(Ti alloy), Ta(Ta alloy)/Al(Al alloy)/Ta(Ta alloy), Ti(Ti alloy)/Al(Al alloy)/TiN, Ta(Ta alloy)/Al(Al alloy)/TaN, Ni(Ni alloy)/Al(Al alloy)/Ni(Ni alloy), Co(Co alloy)/Al(Al alloy)/Co(Co alloy) and Mo(Mo alloy)/Al(Al alloy)/Mo(Mo alloy). The alloy materials may include at least one element selected from the group consisting of Mo, W, Nb, Zr, V, O, and N.

If Cu or a Cu alloy is used for the data wiring (62, 65, 66 and 67), there may be no significant problem with the ohmic contact characteristics of the data wiring (62, 65, 66 and 67) with the pixel electrode 82. Therefore, the data wiring (62, 65, 66 and 67) may be formed as a double layer composed of a Cu or Cu-alloy layer and a Mo, Ti or Ta layer between the semiconductive oxide layer 40. In one exemplary embodiment, the data wiring (62, 65, 66 and 67) may be a double layer such as Mo(Mo alloy)/Cu, Ti(Ti alloy)/Cu, TiN(TiN alloy)/Cu, Ta(Ta alloy)/Cu, or TiOx/Cu.

Referring to FIGS. 1a-1c, the source electrode 65 at least partially overlaps the semiconductive oxide layer 40, and the drain electrode 66 at least partially overlaps the semiconductive oxide layer 40 to face the source electrode 65 with respect to the channel portion of the oxide TFT.

The drain electrode extension portion 67 overlaps a portion of the storage electrode 27, and thus the drain electrode extension portion 67 and the storage electrode 27 form a storage capacitor with the gate insulating layer 30 and the semiconductive oxide layer 40 interposed therebetween. In an alternative exemplary embodiment, when the storage electrode 27 is not disposed, the drain electrode extension portion 67 may not be disposed.

A passivation layer 70 is disposed on the data wiring (62, 65, 66 and 67) and on those parts of the semiconductive oxide layer 40 exposed by openings in the data wiring (62, 65, 66 and 67). Since the passivation layer 70 directly contacts the semiconductive oxide layer 40, the passivation layer 70 may include oxynitride, like the gate insulating layer 30.

In order to better protect the semiconductive oxide layer 40 from external contaminants, the passivation layer 70 may have a double-layered structure including a lower inorganic layer and an upper organic layer. Exemplary embodiments of oxynitride include, but are not limited to, silicon oxynitride, aluminum oxynitride, titanium oxynitride, zirconium oxynitride, hafnium oxynitride, tantalum oxynitride, or tungsten oxynitride. In one exemplary embodiment, silicon oxynitride is preferably used.

Similar to the process of forming the gate insulating layer 30 described above, it is important to reduce the concentration of hydrogen contained in the passivation layer 70 directly contacting the semiconductive oxide layer 40. Accordingly, when a small amount of or little hydrogen is contained in the passivation layer 70, which includes oxynitride, deterioration of the electrical characteristics of the semiconductive oxide layer 40 can be reduced or effectively prevented. In an exemplary embodiment of the invention, the passivation layer 70 preferably has a concentration of oxygen higher than nitrogen along a thickness of the passivation layer 70, as a location along the thickness gets closer to the semiconductive oxide layer 40. The thickness of the passivation layer 70 is taken in the third direction.

Referring to FIG. 1c, a portion 'P' of the passivation layer 70 close to the semiconductive oxide layer 40 preferably has a higher oxygen concentration than a portion 'Q' relatively far (e.g., further than portion 'P') from the semiconductive oxide layer 40. A density of the dots shown in FIG. 1c in an area of portion 'P' is larger than a density of the dots shown in an area of portion 'Q' to illustrate the higher oxygen concentration. In an exemplary embodiment of the invention, when materials of the passivation layer 70 are represented by the formula $MO_xN_{1-x}$, where M is silicon (Si), aluminum (Al), titanium (Ti), zirconium (Zr) hafnium (Hf), tantalum (Ta), or tungsten (W), the passivation layer 70 preferably has a value of x as it gets closer to the semiconductive oxide layer 40 along the thickness of the passivation layer 70, because oxide is more stable than nitride, thereby more effectively improving electrical characteristics of the semiconductive oxide layer 40.

Referring again to FIGS. 1a and 1b, a contact hole 77 exposing the drain electrode extension portion 67 is disposed extended completely through the passivation layer 70. The pixel electrode 82 that is physically and electrically connected to the drain electrode extension portion 67 by extending into the contact hole 77, is disposed on the passivation layer 70. In an exemplary embodiment, the pixel electrode 82 may include a transparent conductor, such as ITO or IZO, or a reflective conductor, such as Al.

The pixel electrode 82 to which data voltage is applied, generates an electric field in conjunction with a common electrode (not shown) of an upper substrate facing the TFT array substrate to control alignment of the liquid crystal molecules of the liquid crystal layer between the pixel electrode 82 and the common electrode.

While it has been described that the insulating layers directly contacting the semiconductive oxide layer 40, that is, the gate insulating layer 30 and the passivation layer 70 both include oxynitride, the invention is not limited to the illustrated exemplary embodiments, and one of the gate insulating layer 30 and the passivation layer 70 may include oxynitride while the other may include silicon nitride or silicon oxide.

Hereinafter, an exemplary embodiment of a method of manufacturing the TFT array substrate according to the invention will be described in detail with reference to FIGS. 1a through 6. FIGS. 2 to 6 are cross-sectional views respectively showing exemplary embodiments of fabricating processes of a portion of the TFT substrate shown in FIG. 1a.

Figure 2:
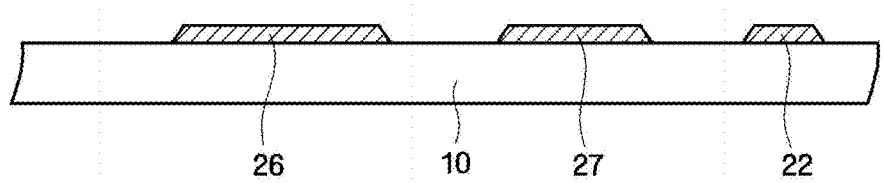

Referring first to FIGS. 1a and 2, the gate line 22, the gate electrode 24, the storage electrode 27, and the storage line 28 are formed on the insulating substrate 10. The insulating substrate 10 generally uses a transparent glass or plastic material, for example, soda lime glass, or borosilicate glass. The gate wiring (22 and 26) and the storage line 28 may be formed by sputtering. In patterning the gate wiring (22 and 26) and the storage line 28, wet etching or dry etching may be used. The wet etching can be performed using an etching solution, such as phosphoric acid, nitric acid, or acetic acid. The dry etching can be performed using a chlorine-based etching gas, e.g., $Cl_2$, $BCl_3$, or the like.

Figure 3:
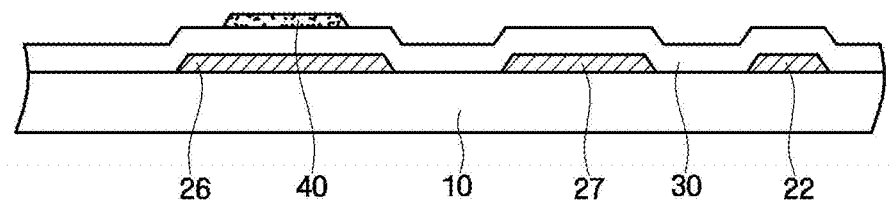

Next, referring to FIGS. 1a and 3, the gate insulating layer 30 made of oxynitride is deposited on the insulation substrate 10 and directly on the gate wiring (22, 26) by, for example, plasma enhanced chemical vapor deposition ("PECVD") or reactive sputtering. The gate insulating layer 30 including oxynitride may be formed by reacting a base gas with $N_2O$ gas and $N_2$ gas. The base gas may be a gas, such as silicon (Si), aluminum (Al), titanium (Ti), zirconium (Zr), hafnium (Hf), tantalum (Ta), or tungsten (W), in cooperation with $N_2O$ gas. $O_2$ gas may be used instead of $N_2O$ gas. In one exemplar embodiment, $N_2O$ gas and $N_2$ gas may be reacted with $SiH_4$ gas as a base gas, thereby forming silicon oxynitride.

The concentration of the gate insulating layer 30 may be controlled by adjusting a partial pressure ratio of $N_2O$ gas (or $O_2$ gas) as a reaction gas to $N_2$ gas such that the gate insulating layer 30 may have a concentration of oxygen higher than nitrogen along its thickness as a location in the thickness gets closer to the semiconductive oxide layer 40. That is to say, during deposition of the gate insulating layer 30, the partial ratio of $N_2O$ gas (or $O_2$ gas) is gradually raised, thereby forming an oxynitride layer with a gradation in the oxygen concentration.

However, the invention is not limited to the above-described process, and the oxynitride layer with an oxygen concentration gradation can be alternatively formed by sequentially forming a nitride layer and an oxide layer on the gate wiring (22 and 26) and then performing heat treatment, e.g., annealing. In other words, even when the nitride layer and the oxide layer are separately deposited, a boundary between the nitride layer and the oxide layer is substantially removed by a subsequent annealing process, so that nitrogen in the nitride layer is diffused into the oxide layer and oxygen in the oxide layer is diffused into the nitride layer, thereby forming an oxynitride layer with a gradation in the oxygen concentration.

Referring again to FIGS. 1a and 3, the semiconductive oxide layer 40 is formed directly on the gate insulating layer 30.

Figure 4:
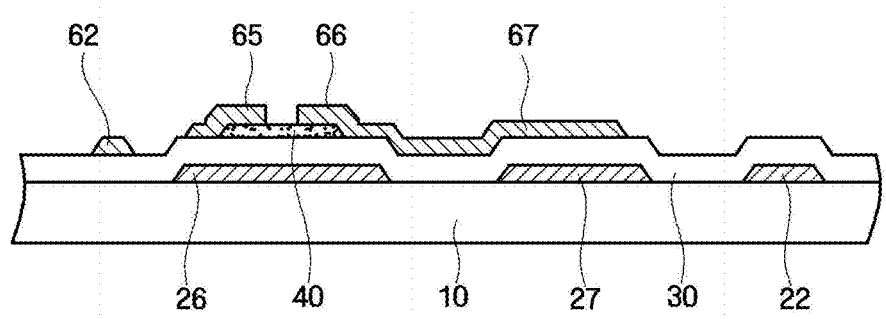

Referring to FIGS. 1a and 4, data wiring (62, 65, 66 and 67) is formed directly on the gate insulating layer 30 and the semiconductive oxide layer 40 by, for example, sputtering. The source electrode 65 and the drain electrode 66 are separated from each other in opposite directions with respect to the gate electrode 26, and the drain electrode extension portion 67 extending from the drain electrode 66 overlaps the storage electrode 27 in the plan view of the TFT substrate.

Figure 5:
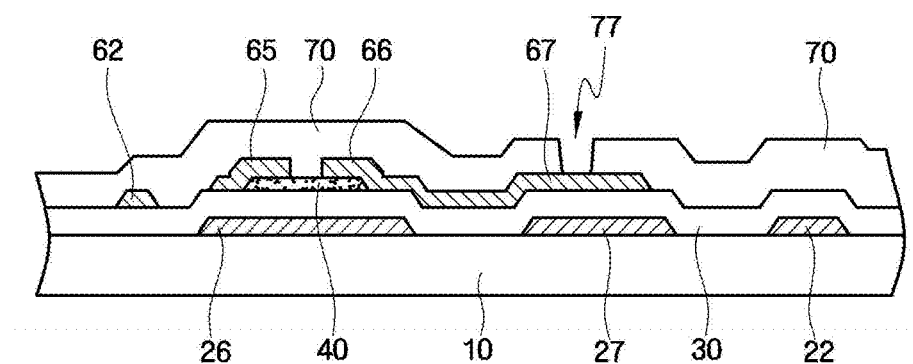

As shown in FIG. 5, the passivation layer 70 made of oxynitride is formed by, for example, plasma enhanced chemical vapor deposition (PECVD) or reactive sputtering. The passivation layer 70 including oxynitride may be formed by reacting $N_2O$ gas as a base gas with $N_2$ gas. The base gas may be a gas, such as silicon (Si), aluminum (Al), titanium (Ti), zirconium (Zr), hafnium (Hf), tantalum (Ta), or tungsten (W), in cooperation with $N_2O$ gas. $O_2$ gas may be used instead of $N_2O$ gas. In one exemplary embodiment, $N_2O$ gas and $N_2$ gas may be reacted with $SiH_4$ gas as a base gas, thereby forming silicon oxynitride.

The concentration of the passivation layer 70 may be controlled by adjusting a partial pressure ratio of $N_2O$ gas (or $O_2$ gas) as a reaction gas to $N_2$ gas such that the passivation layer 70 may have a concentration of oxygen higher than nitrogen along its thickness as a location in the thickness gets closer to the semiconductive oxide layer 40. That is to say, the partial ratio of $N_2O$ gas (or $O_2$ gas) is gradually increased during deposition of the passivation layer 70, thereby forming an oxynitride layer with a gradation in the oxygen concentration.

However, the invention is not limited to the above-described process, and the oxynitride layer with an oxygen concentration gradation can be alternatively formed by sequentially forming a nitride layer and an oxide layer on the data wiring (62, 65, 66 and 67) and then performing heat treatment, e.g., annealing. In other words, even when the nitride layer and the oxide layer are separately deposited, a boundary between the nitride layer and the oxide layer is substantially removed by a subsequent annealing process, so that nitrogen in the nitride layer is diffused into the oxide layer and oxygen in the oxide layer is diffused into the nitride layer, thereby forming an oxynitride layer with a gradation in the oxygen concentration.

Subsequently, the passivation layer 70 is patterned, such as using photolithography, thereby forming the contact hole 77 exposing the drain electrode extension portion 67.

Figure 6:
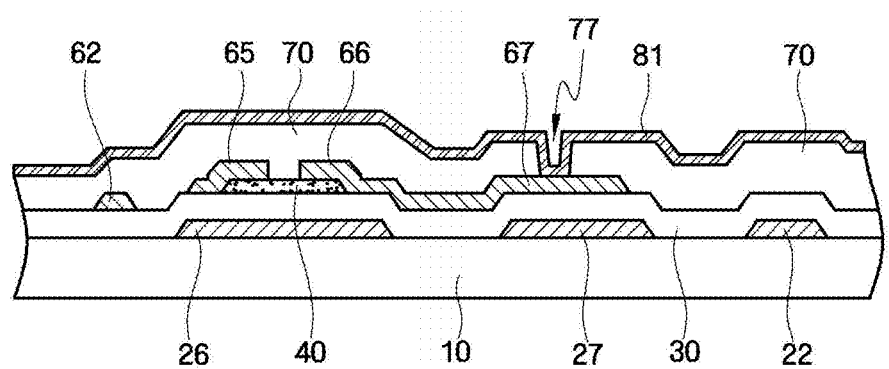

Referring to FIG. 6, a conductive film 81 for forming a pixel electrode, which is partially connected to the data wiring (62, 65, 66 and 67), is formed directly on the passivation layer 70. In an exemplary embodiment, the conductive film 81 may include a transparent conductor, such as ITO or IZO, or a reflective conductor such as Al.

Referring to FIGS. 6 and 1b, the conductive film 81 is patterned, thereby forming the pixel electrode 82.

Figure 7:
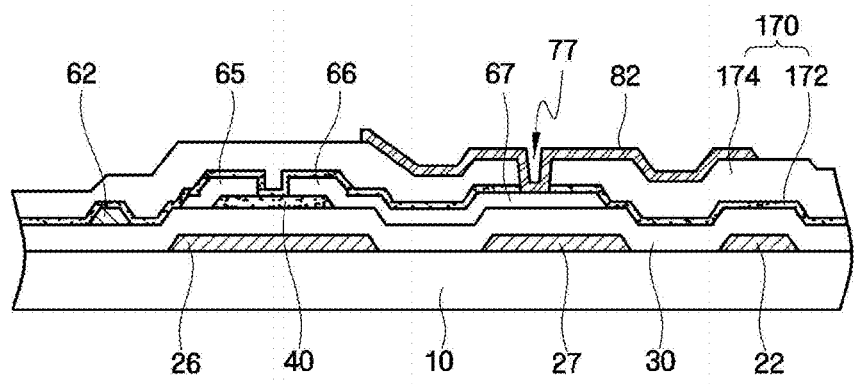
FIG. 7 is a cross-sectional view of another exemplary embodiment of a TFT substrate for an LCD according to the invention.

Hereinafter, another exemplary embodiment of a TFT array substrate according to the invention will be described in detail with reference to FIG. 7. FIG. 7 is a cross-sectional view of a TFT substrate for an LCD according to the invention.

For brevity of explanation, the same functional elements as those shown in the drawings of FIGS. 1a-6 of the invention are denoted by the same reference numerals, and a detailed explanation thereof will not be given.

Referring to FIG. 7, a passivation layer 170 includes a lower passivation layer 172 directly contacting the semiconductive oxide layer 40, and an upper passivation layer 174 disposed on the lower passivation layer 172, such that the upper passivation layer 174 does not contact the semiconductive oxide layer 40. To reduce or effectively prevent deterioration of the electrical characteristics of the semiconductive oxide layer 40, the lower passivation layer 172 may include oxide, such as silicon oxide, aluminum oxide, titanium oxide, zirconium oxide, hafnium oxide, tantalum oxide, or tungsten oxide. In one exemplary embodiment, silicon oxide is preferably used.

The upper passivation layer 174 may include nitride, such as silicon nitride, aluminum nitride, titanium nitride, zirconium nitride, hafnium nitride, tantalum nitride, or tungsten nitride. In one exemplary embodiment, silicon nitride is preferably used. The lower passivation layer 172 may be formed to a thickness of about 50 nanometers (nm) to about 400 nm, and the upper passivation layer 174 may be formed to a thickness of about 50 nm to about 400 nm.

When the lower passivation layer 172 contacting the semiconductive oxide layer 40 includes oxide, e.g., silicon oxide, $N_2O$ gas or $O_2$ gas, instead of a hydrogen-containing gas, is used as a reaction gas in a process of forming the passivation layer 170, resulting in minimal hydrogen is contained in the lower passivation layer 172. Accordingly, it is possible to reduce or effectively prevent deterioration of the electrical characteristics of the semiconductive oxide layer 40.

Figure 8:
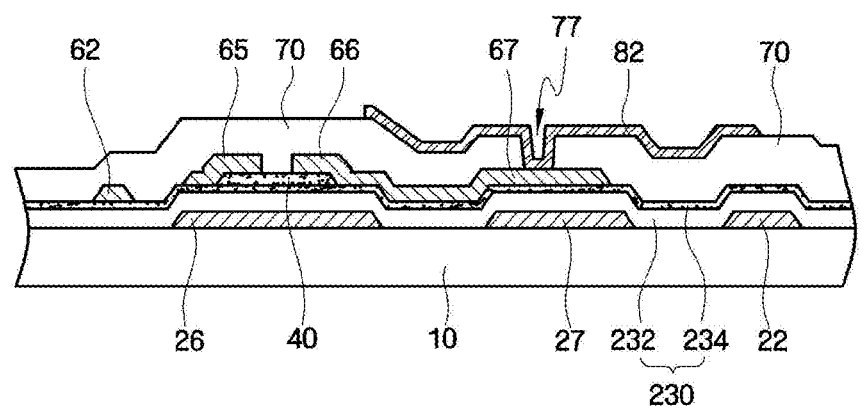
FIG. 8 is a cross-sectional view of another exemplary embodiment of a TFT substrate for an LCD according to the invention.

Hereinafter, another exemplary embodiment of a TFT array substrate according to the invention will be described in detail with reference to FIG. 8. FIG. 8 is a cross-sectional view of a TFT substrate for an LCD according to the invention.

For brevity of explanation, the same functional elements as those shown in the drawings of FIGS. 1a-6 of the invention are denoted by the same reference numerals, and a detailed explanation thereof will not be given.

Referring to FIG. 8, a gate insulating layer 230 includes a lower insulating layer 232 disposed over the gate line 22, and an upper insulating layer 234 disposed directly on the lower insulating layer 232, such that a portion of the gate insulating layer 230 does not contact the semiconductive oxide layer 40. In the illustrated embodiment, the lower insulating layer 232 does not contact the semiconductive oxide layer 40. The lower insulating layer 232 may include nitride, such as silicon nitride, aluminum nitride, titanium nitride, zirconium nitride, hafnium nitride, tantalum nitride, or tungsten nitride. In one exemplary embodiment, silicon nitride is preferably used.

To reduce or effectively prevent deterioration of the electrical characteristics of the semiconductive oxide layer 40, the upper insulating layer 234 may include oxide, such as silicon oxide, aluminum oxide, titanium oxide, zirconium oxide, hafnium oxide, tantalum oxide, or tungsten oxide. In one exemplary embodiment, silicon oxide is preferably used. The lower insulating layer 232 may be formed to a thickness of about 50 nm to about 200 nm, and the upper insulating layer 234 may be formed to a thickness of about 50 nm to about 200 nm.

When the upper insulating layer 234 contacting the semiconductive oxide layer 40 includes oxide, e.g., silicon oxide, $N_2O$ gas or $O_2$ gas, instead of a hydrogen-containing gas, is used as a reaction gas in a process of forming the gate insulating layer 230, resulting in minimal hydrogen is contained in the upper insulating layer 234. Accordingly, it is possible to reduce or effectively prevent deterioration of the electrical characteristics of the semiconductive oxide layer 40.

Figure 9:
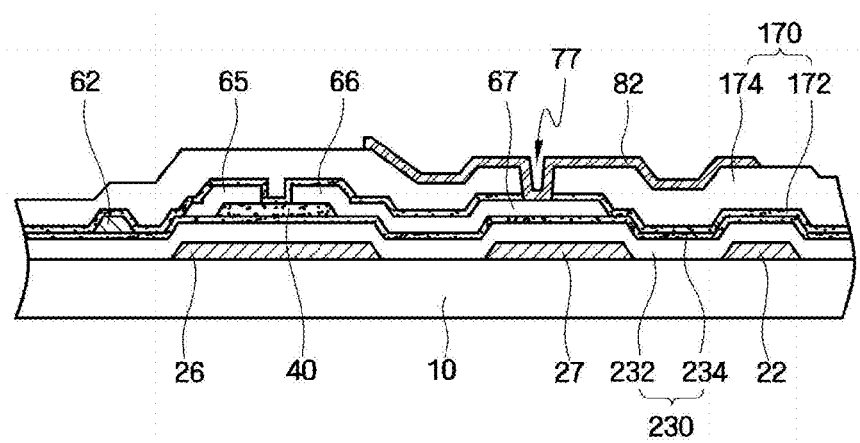
FIG. 9 is a cross-sectional view of another exemplary embodiment of a TFT substrate for an LCD according to the invention.

Hereinafter, another exemplary embodiment of a TFT array substrate according to the invention will be described in detail with reference to FIG. 9. FIG. 9 is a cross-sectional view of a TFT substrate for an LCD according to the invention. For brevity of explanation, the same functional elements as those shown in the drawings of FIGS. 1a-6 of the invention are denoted by the same reference numerals, and a detailed explanation thereof will not be given.

Referring to FIG. 9, a gate insulating layer 230 includes a lower insulating layer 232 disposed overlapping the gate line 22, and an upper insulating layer 234 disposed directly on the lower insulating layer 232, such that a portion of the gate insulating layer 230 does not contact the semiconductive oxide layer 40. In one exemplary embodiment, the lower insulating layer 232 does not contact the semiconductive oxide layer 40. The lower insulating layer 232 may include nitride, such as silicon nitride, aluminum nitride, titanium nitride, zirconium nitride, hafnium nitride, tantalum nitride, or tungsten nitride. In one exemplary embodiment, silicon nitride is preferably used. To reduce or effectively prevent deterioration of the electrical characteristics of the semiconductive oxide layer 40, the upper insulating layer 234 may include oxide, such as silicon oxide, aluminum oxide, titanium oxide, zirconium oxide, hafnium oxide, tantalum oxide, or tungsten oxide. In one exemplary embodiment, silicon oxide is preferably used.

In addition, a passivation layer 170 includes a lower passivation layer 172 directly contacting the semiconductive oxide layer 40, and an upper passivation layer 174 disposed on the lower passivation layer 172, such that a portion of the passivation layer 170 does not contact the semiconductive oxide layer 40. To reduce or effectively prevent deterioration of the electrical characteristics of the semiconductive oxide layer 40, the lower passivation layer 172 may include oxide, such as silicon oxide, aluminum oxide, titanium oxide, zirconium oxide, hafnium oxide, tantalum oxide, or tungsten oxide. In one exemplary embodiment, silicon oxide is preferably used. The upper passivation layer 174 may include nitride, such as silicon nitride, aluminum nitride, titanium nitride, zirconium nitride, hafnium nitride, tantalum nitride, or tungsten nitride. In one exemplary embodiment, silicon nitride is preferably used.

While the TFT substrates according to the above-described embodiments of the invention are applied to a bottom gate structure in which a gate electrode is disposed under a semiconductive oxide layer, by way of example, the invention is not limited thereto. Alternatively, the TFT substrates according to the above-described embodiments of the invention can also be applied to a top gate structure in which a gate electrode is disposed on (e.g., above) a semiconductive oxide layer.

Figure 10:
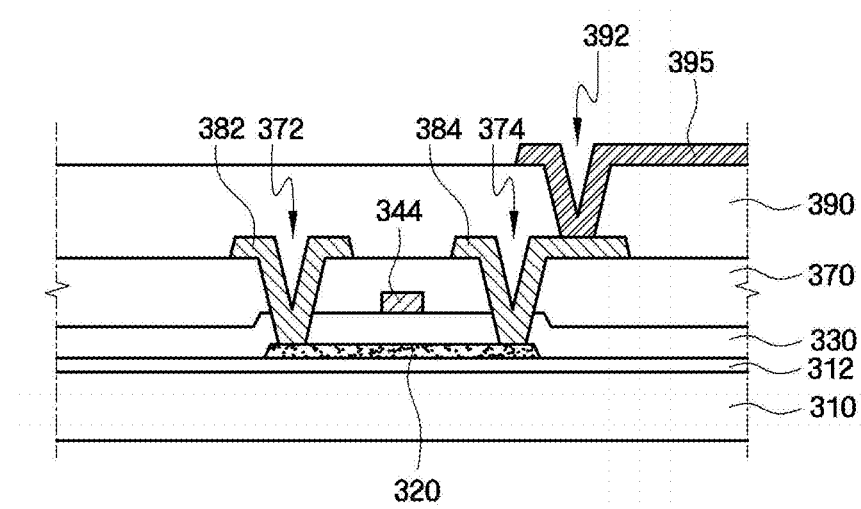
FIG. 10 is a cross-sectional view of an alternative exemplary embodiment of a TFT substrate for an LCD according to the invention.
Figure 11:
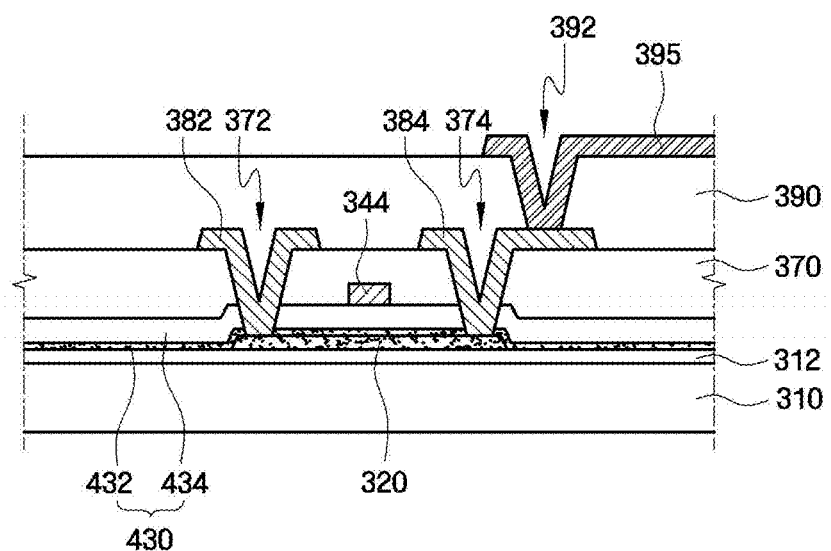
FIG. 11 is a cross-sectional view of another alternative exemplary embodiment of a TFT substrate for an LCD according to the invention.

Hereinafter, an alternative exemplary embodiment of a TFT array substrate having a top gate structure according to several embodiments of the invention will be described with reference to FIGS. 10 and 11. FIG. 10 is a cross-sectional view of a TFT substrate for an LCD according to the invention, and FIG. 11 is a cross-sectional view of another alternative exemplary embodiment of a TFT substrate for an LCD according to the invention.

Referring to FIG. 10, a buffer layer 312 is disposed on an insulating substrate 310 including silicon oxide, silicon nitride, or silicon oxynitride. To reduce or effectively prevent deterioration of electrical characteristics of a semiconductive oxide layer 320 disposed directly on the buffer layer 312, the buffer layer 312 preferably includes oxynitride. Exemplary embodiment of the oxynitride include, but are not limited to, silicon oxynitride, aluminum oxynitride, titanium oxynitride, zirconium oxynitride, hafnium oxynitride, tantalum oxynitride, or tungsten oxynitride. In one exemplary embodiment, silicon oxynitride is preferably used. The buffer layer 312 preferably has a concentration of oxygen higher than nitrogen along a thickness of the buffer layer 312 as a location in the thickness gets closer to the semiconductive oxide layer 320. Further, the buffer layer 312 may have a double-layered structure, such as including a lower nitride layer and an upper nitride layer. However, the buffer layer 312 is not limited thereto.

The semiconductive oxide layer 320 including an oxide selected from a group consisting of Zn, In, Ga, Sn and combinations thereof, is disposed directly on the buffer layer 312. Exemplary of the semiconductive oxide layer 320 include composite oxides such as ZnO, InZnO, InGaO, InSnO, ZnSnO, GaSnO, GaZnO, GaZnSnO, or GaInZnO.

A gate insulating layer 330 is disposed on the insulating layer 310 and the semiconductive oxide layer 320. The gate insulating layer 330 may include oxynitride. Exemplary embodiments of the oxynitride include, but are not limited to, silicon oxynitride, aluminum oxynitride, titanium oxynitride, zirconium oxynitride, hafnium oxynitride, tantalum oxynitride, or tungsten oxynitride. In one exemplary embodiment, silicon oxynitride is preferably used. The gate insulating layer 330 preferably has a concentration of oxygen higher than nitrogen along a thickness of the gate insulating layer 330 as a location in the thickness gets closer to the semiconductive oxide layer 320.

In the illustrated embodiment of the invention, the gate insulating layer 330 preferably includes silicon oxynitride in order to reduce the content of hydrogen in the gate insulating layer 330 directly contacting the semiconductive oxide layer 320. Since the gate insulating layer 330 has a very small minimal amount of hydrogen or little hydrogen, deterioration of the electrical characteristics of the semiconductive oxide layer 320 can be reduced or effectively prevented.

A gate electrode 344 is disposed on the gate insulating layer 330 to overlap the semiconductive oxide layer 320.

A first interlayer insulating layer 370 is disposed on the gate insulating layer 330 and the gate electrode 344. The first interlayer insulating layer 370 generally includes silicon oxide, silicon nitride or silicon oxynitride, and may be formed such as by using chemical vapor deposition ("CVD"). A pair of contact holes 372 and 374 partially exposing the semiconductive oxide layer 320 positioned at opposite sides of the gate electrode 344 are disposed extended completely through the first interlayer insulating layer 370 and the gate insulating layer 330.

A source electrode 382 and a drain electrode 384, which are both physically and electrically connected to the semiconductive oxide layer 320 through the pair of contact holes 372 and 374, are disposed directly on the first interlayer insulating layer 370.

A second interlayer insulating layer 390, which includes an organic material having a good planarizing characteristic and photosensitivity, is disposed on the source electrode 382, the drain electrode 384, and the first interlayer insulating layer 370. In one exemplary embodiment, the second interlayer insulating layer 390 may include an organic material, e.g., acryl resin, and may be formed such as by using a spin coating method. A contact hole 392 exposing the drain electrode 384 is disposed extended completely through the second interlayer insulating layer 390.

A transparent pixel electrode 395 physically and electrically connected to the drain electrode 384 through the contact hole 392 is disposed on the second interlayer insulating layer 390.

Hereinafter, another alternative exemplary embodiment of a TFT array substrate according to the invention will be described in detail with reference to FIG. 11. FIG. 11 is a cross-sectional view of a TFT substrate for an LCD according to the invention. For brevity of explanation, the same functional elements as those shown in the drawings of FIG. 10 of the invention are denoted by the same reference numerals, and a detailed explanation thereof will not be given.

Referring to FIG. 11, a gate insulating layer 430 includes a lower insulating layer 432 directly contacting the semiconductive oxide layer 320, and an upper insulating layer 434 disposed on the lower insulating layer 432, such that a portion of the gate insulating layer 430 does not to contact the semiconductive oxide layer 320. To reduce or effectively prevent deterioration of the electrical characteristics of the semiconductive oxide layer 320, the lower insulating layer 432 may include oxide, such as silicon oxide, aluminum oxide, titanium oxide, zirconium oxide, hafnium oxide, tantalum oxide, or tungsten oxide. In one exemplary embodiment, silicon oxide is preferably used.

The upper insulating layer 434 may include nitride, such as silicon nitride, aluminum nitride, titanium nitride, zirconium nitride, hafnium nitride, tantalum nitride, or tungsten nitride. In one exemplary embodiment, silicon nitride is preferably used.

When the lower insulating layer 432 directly contacting the semiconductive oxide layer 320 includes oxide, e.g., silicon oxide, $N_2O$ gas or $O_2$ gas, instead of hydrogen, is used as a reaction gas in a process of forming the gate insulating layer 230, resulting in minimal hydrogen is contained in the lower passivation layer 432. Accordingly, it is possible to reduce or effectively prevent deterioration of the electrical characteristics of the semiconductive oxide layer 432.

Hereinafter, electrical characteristics of semiconductive oxide TFTs will be described with reference to FIGS. 12 through 15, in a case where a passivation layer, disposed on a semiconductive oxide layer provided in the semiconductive oxide TFTs, includes a lower passivation layer made of silicon oxide and an upper passivation layer made of silicon nitride. In the following examples, it will be described that the passivation layer has a double-layered structure of an oxide layer and a nitride layer, but the invention is not limited thereto. Alternatively, the gate insulating layer may have a double-layered structure of an oxide layer and a nitride layer, or both the passivation layer and the gate insulating layer may have a single-layered structure with a gradation in the oxygen concentration. In either case, substantially the same electrical characteristics can be observed.

Figure 12:
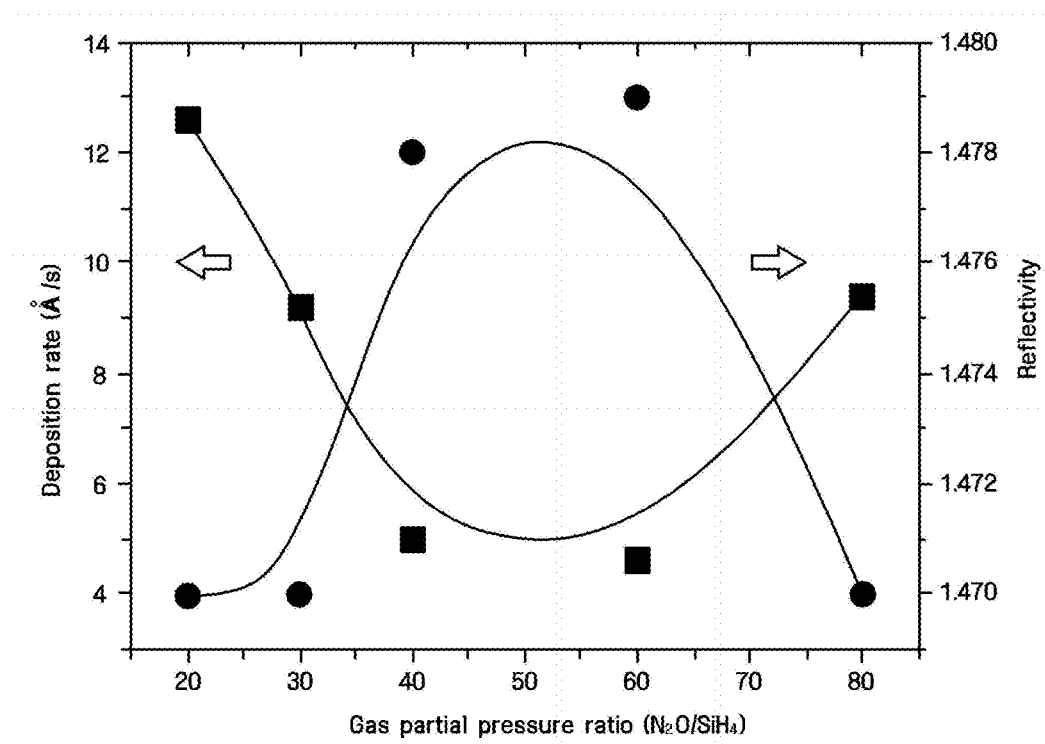
FIG. 12 is a graph showing an exemplary embodiment of a deposition rate and refractivity of silicon oxide depending on a partial pressure ratio of source gas according to the invention.

FIG. 12 is a graph showing an exemplary embodiment of a deposition rate and refractivity of silicon oxide depending on a partial pressure ratio of source gas, according to the invention. In this experimental example, $SiH_4$ gas was reacted with $N_2O$ gas by PECVD to form silicon oxide.

Referring to FIG. 12, as a partial pressure ratio of $N_2O$ gas to $SiH_4$ gas was increased, a deposition rate of silicon oxide showed an initial increase and a later decrease, indicated by the data points "●" and the corresponding curve. A reflectivity of a material is generally proportionate to its density, indicated by the data points "■" and the corresponding curve. As the partial pressure ratio of silicon oxide increases, the density thereof will increase to then decrease. Since the higher density of silicon oxide is advantageous, the partial pressure ratio of silicon oxide is preferably in the range of approximately 0.35-0.75.

Figure 13A:
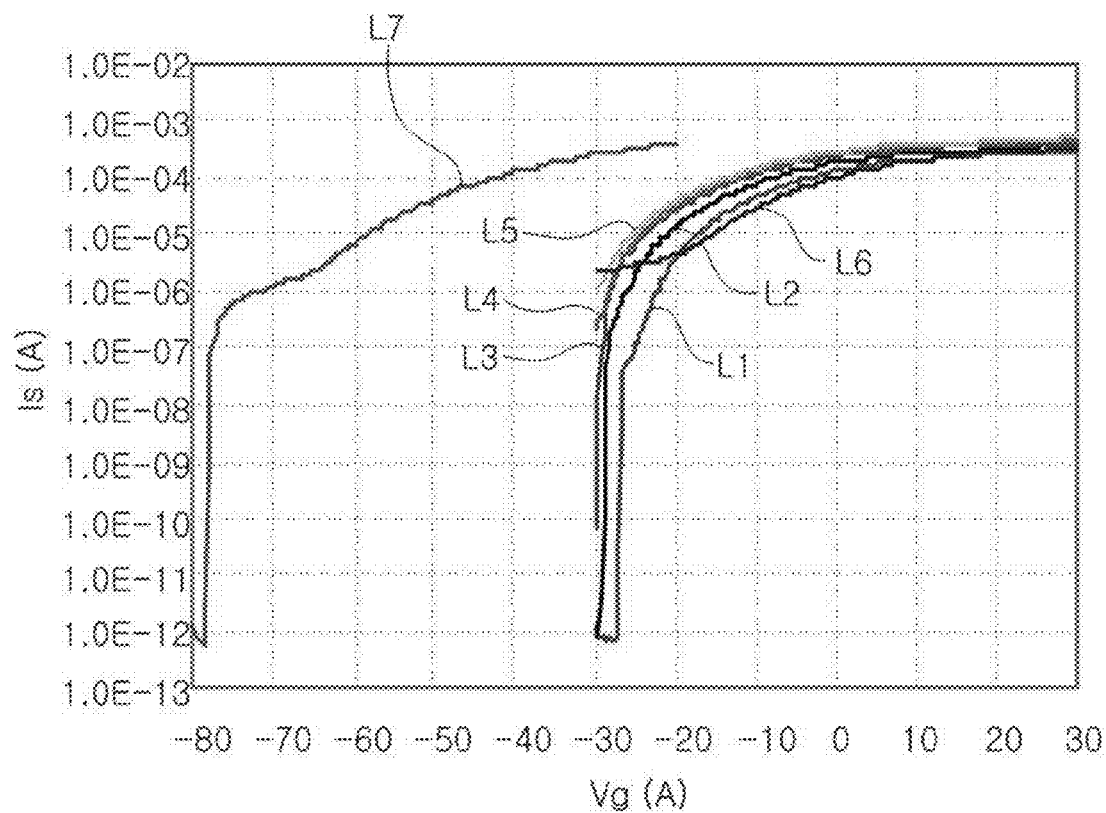
FIG. 13a is a graph showing an amount of current (Is) flowing a semiconductive oxide layer depending on a change in the gate voltage (Vg) as a comparative experimental example.

A diurnal variation in the electrical characteristics of a semiconductive oxide TFT will be described with reference to FIGS. 13a and 13b, in a case where a passivation layer has a single layer made of silicon oxide or a double-layered structure of a silicon oxide layer and a silicon nitride layer. FIG. 13a is a graph showing the amount of current (Is) flowing a semiconductive oxide layer depending on a change in the gate voltage (Vg) as a comparative experimental example, and FIG. 13b is a graph showing the amount of current (Is) flowing a semiconductive oxide layer depending on a change in the gate voltage (Vg) as an experimental example of the invention.

In FIG. 13a, the passivation layer was formed of a silicon oxide layer only having a thickness of approximately 200 nm. The silicon oxide layer was formed under the processing condition of a partial pressure ratio of $N_2O$ gas to $SiH_4$ gas being 0.60. Curves L1, L2, L3, L4, L5, L6, and L7 represent the electrical characteristics of samples of semiconductive oxide TFTs observed immediately, one day, two days, three days, four days, five days, and six days after forming the passivation layer.

Figure 13B:
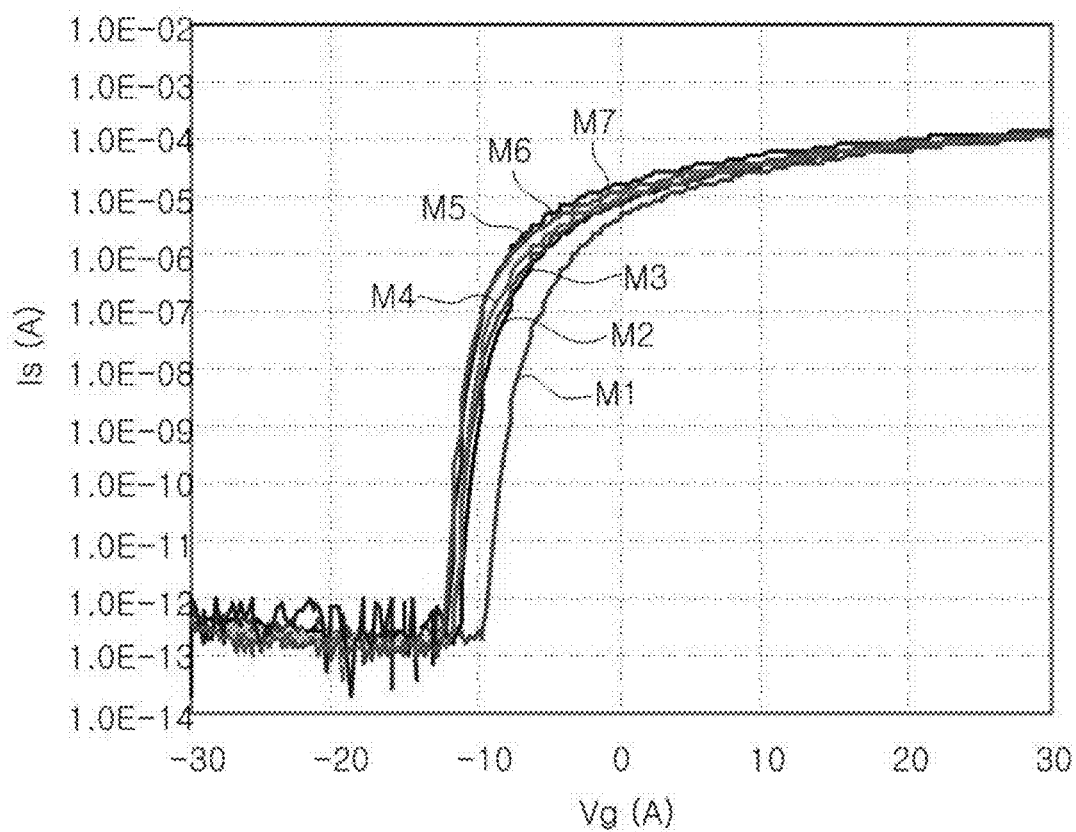
FIG. 13b is a graph showing an exemplary embodiment of an amount of current (Is) flowing a semiconductive oxide layer depending on a change in the gate voltage (Vg) as an experimental example of the invention.

In FIG. 13b, the passivation layer was formed of a silicon oxide layer having a thickness of approximately 100 nm and a silicon nitride layer having a thickness of approximately 100 nm. The silicon nitride layer was formed under the processing condition of a partial pressure ratio of $N_2O$ gas to $SiH_4$ gas being 0.60. Curves M1, M2, M3, M4, M5, M6, and M7 represent the electrical characteristics of samples of semiconductive oxide TFTs observed immediately, one day, two days, three days, four days, five days, and six days after forming the passivation layer.

Referring to FIG. 13a, when the passivation layer is formed of a silicon oxide layer only, a threshold voltage of the semiconductive oxide TFT sharply drops after a prolonged time of period, e.g., six days after forming the passivation layer. In a case of forming the passivation layer using only the silicon oxide layer, the semiconductive oxide layer may be easily damaged due to external environmental factors, e.g., moisture ($H_2O$), in the course of manufacturing the TFT array substrate. The sharp drop in the threshold voltage maintains the TFT to be turned 'ON' all the time with respect to all gate driving voltages, thereby making the TFT lose its switching function.

In contrast, referring to FIG. 13b, when the passivation layer is formed of a silicon oxide layer and a silicon nitride layer, specifically when the passivation layer has a silicon oxide layer contacting directly the semiconductive oxide layer, a threshold voltage of the semiconductive oxide TFT showed little change even after a prolonged time of period. That is to say, in a case of forming the passivation layer using the silicon oxide layer and the silicon nitride layer, the semiconductive oxide layer can be effectively protected against moisture ($H_2O$), in the course of manufacturing the TFT array substrate.

Figure 14A:
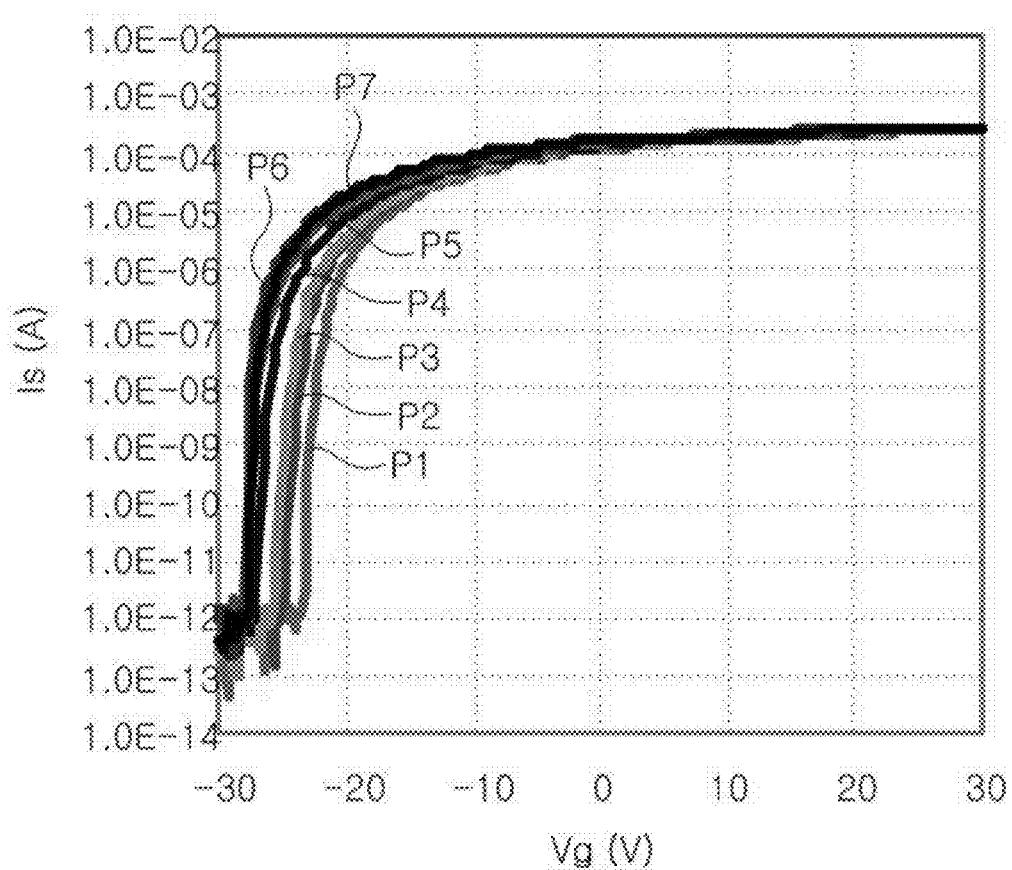
FIG. 14a is a graph showing a bias temperature stress ("BTS") test result as a comparative experimental example.

BTS (bias temperature stress) test results will be described with reference to FIGS. 14a, 14b and 15, in a case where a passivation layer has a single layer made of silicon oxide or a double-layered structure of a silicon oxide layer and a silicon nitride layer. FIG. 14a is a graph showing a BTS test result as a comparative experimental example, FIG. 14b is a graph showing a BTS test result as an experimental example of the invention, and FIG. 15 is a graph showing a variation in the threshold voltage (Vth) over time in the experimental example shown in FIG. 14b.

To perform a BTS test, a voltage in the range of −20 V to 20 V is applied to a gate electrode of a semiconductive oxide TFT at a temperature of approximately 60 Celsius (° C.) and a voltage of 10 V is applied between a source electrode and a drain electrode.

In detail, in FIG. 14a, the passivation layer was formed of a silicon oxide layer only having a thickness of approximately 200 nm. The silicon nitride layer was formed under the processing condition of a partial pressure ratio of $N_2O$ gas to $SiH_4$ gas being 0.60. Curves P1, P2, P3, P4, P5, P6, and P7 represent the electrical characteristics of samples of semiconductive oxide TFTs observed at the BTS test time of 0 second (sec), 10 sec, 30 sec, 100 sec, 300 sec, 1000 sec, and 3600 sec, respectively.

Figure 14B:
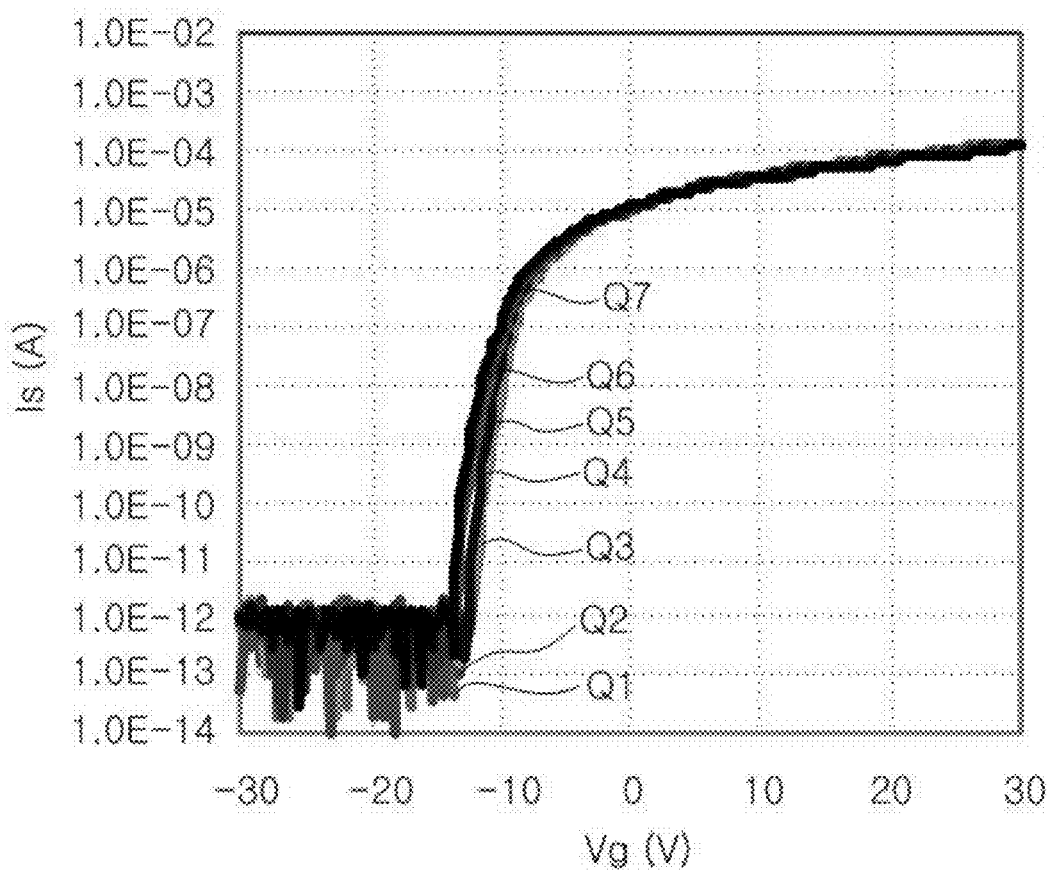
FIG. 14b is a graph showing an exemplary embodiment of a BTS test result as an experimental example of the invention.
Figure 15:
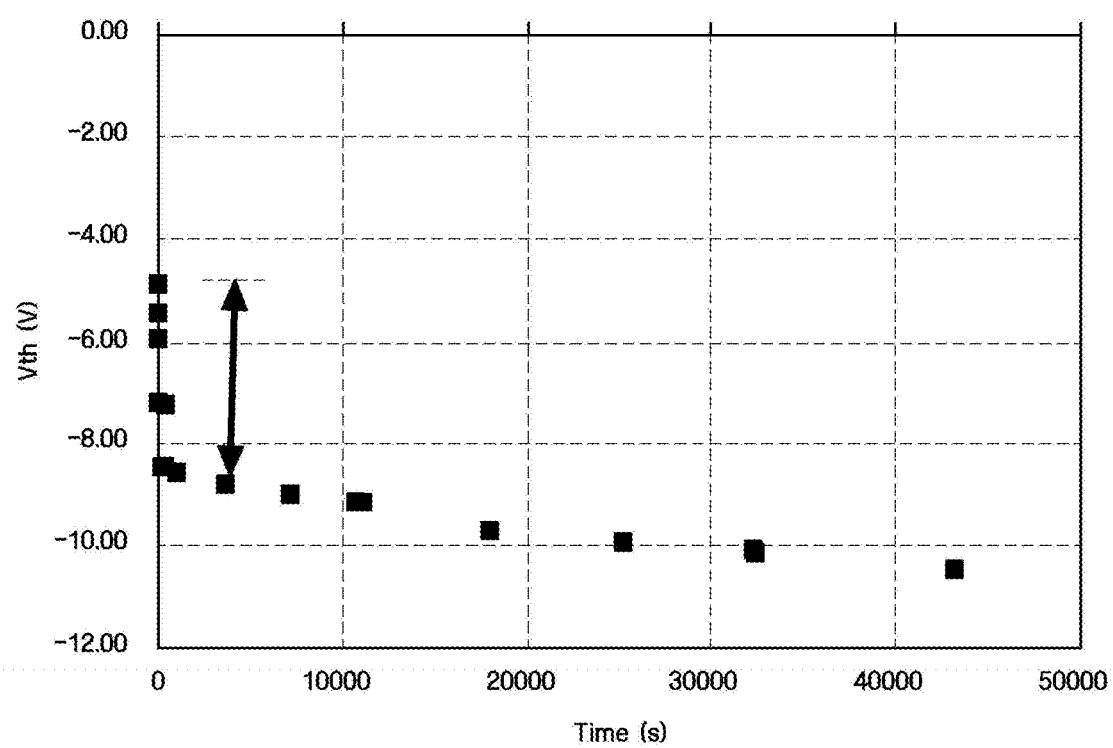
FIG. 15 is a graph showing an exemplary embodiment of a variation in the threshold voltage (Vth) over time in the experimental example shown in FIG. 14b.

In FIG. 14b, the passivation layer was formed of a silicon oxide layer having a thickness of approximately 100 nm and a silicon nitride layer having a thickness of approximately 100 nm. The silicon nitride layer was formed under the processing condition of a partial pressure ratio of $N_2O$ gas to $SiH_4$ gas being 0.60. Curves Q1, Q2, Q3, Q4, Q5, Q6, and Q7 represent the electrical characteristics of samples of semiconductive oxide TFTs observed at the BTS test time of 0 sec, 10 sec, 30 sec, 100 sec, 300 sec, 1000 sec, and 3600 sec, respectively.

Referring to FIG. 14a, one hour (3600 sec) after performing the BTS test, a gate voltage Vg for obtaining the same current Is was changed by approximately −4.90 V.

Referring to FIG. 14b, one hour (3600 sec) after performing the BTS test, a gate voltage Vg for obtaining the same current Is was changed by approximately −1.24. V.

Therefore, in the case of the passivation layer formed of a silicon oxide layer and a silicon nitride layer of the experimental example of the invention, a minimal change in the gate voltage Vg, which was significantly lower than the comparative experimental example, was demonstrated even after performing the BTS test, suggesting that a reliable TFT was obtained.

As shown in FIG. 15, a variation in the threshold voltage Vth of the TFT array substrate manufactured according to the experimental example of the invention was measured over time. The measurement result showed that most of the variation in the threshold voltage Vth of the TFT array substrate was attributable to an initial change within one hour, and substantially no change in the threshold voltage Vth was observed. Accordingly, even after a prolonged period of use, the TFT array substrate according to the experimental example of the invention has a substantially constant value of threshold voltage Vth, thereby realizing the reliable TFT.

While the invention has been particularly shown and described with reference to exemplary embodiments thereof, it will be understood by those of ordinary skill in the art that various changes in form and details may be made therein without departing from the spirit and scope of the invention as defined by the following claims. It is therefore desired that the illustrated exemplary embodiments be considered in all respects as illustrative and not restrictive, reference being made to the appended claims rather than the foregoing description to indicate the scope of the invention.

What is claimed is:

1. A thin film transistor array substrate comprising:
    a semiconductive oxide layer disposed on an insulating substrate and including a channel portion;
    a gate electrode overlapping the semiconductive oxide layer;
    a gate insulating layer interposed between the semiconductive oxide layer and the gate electrode; and
    a passivation layer disposed on the semiconductive oxide layer,
    wherein the gate insulating layer and the passivation layer each includes an oxide layer, and a nitride layer which is separate from the oxide layer, the oxide layer contacting the semiconductive oxide layer, and the nitride layer not contacting the semiconductive oxide layer.

2. The thin film transistor array substrate of claim 1, wherein the oxide layer comprises silicon oxide, aluminum oxide, titanium oxide, zirconium oxide, hafnium oxide, tantalum oxide, or tungsten oxide.

3. The thin film transistor array substrate of claim 1, wherein the nitride layer comprises silicon nitride, aluminum nitride, titanium nitride, zirconium nitride, hafnium nitride, tantalum nitride, or tungsten nitride.

4. The thin film transistor array substrate of claim 1, wherein the semiconductive oxide layer comprises an oxide selected from an element group consisting of Zn, In, Ga, Sn and combinations thereof.

5. The thin film transistor array substrate of claim 1, wherein
    the gate insulating layer interposed between the semiconductive oxide layer and the gate electrode is disposed directly on and contacting the gate electrode the gate electrode being disposed between the gate insulating layer and the insulating substrate,
    the semiconductive oxide layer is disposed directly on and contacting the gate insulating layer interposed between the semiconductive oxide layer and the gate electrode, and
    the passivation layer is disposed directly on and contacting the semiconductive oxide layer contacting the gate insulating layer.

* * * * *